United States Patent
Takemura

(10) Patent No.: US 8,975,680 B2
(45) Date of Patent: Mar. 10, 2015

(54) SEMICONDUCTOR MEMORY DEVICE AND METHOD MANUFACTURING SEMICONDUCTOR MEMORY DEVICE

(75) Inventor: Yasuhiko Takemura, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 497 days.

(21) Appl. No.: 13/369,679

(22) Filed: Feb. 9, 2012

(65) Prior Publication Data

US 2012/0213000 A1    Aug. 23, 2012

(30) Foreign Application Priority Data

Feb. 17, 2011   (JP) ................................ 2011-031788

(51) Int. Cl.
*H01L 27/108*   (2006.01)
*H01L 27/115*   (2006.01)

(52) U.S. Cl.
CPC ........ *H01L 27/108* (2013.01); *H01L 27/10844* (2013.01); *H01L 27/1156* (2013.01)
USPC ..................... 257/300; 257/296; 257/E27.084

(58) Field of Classification Search
CPC ...... G11C 11/24; G11C 11/34; G11C 11/401; G11C 11/402; G11C 11/4023; G11C 11/405; H01L 27/108; H01L 27/10844
USPC .......... 365/149, 174, 182, 222; 257/296, 300, 257/E27.084
See application file for complete search history.

(56) References Cited

U.S. PATENT DOCUMENTS

| | | | |
|---|---|---|---|
| 4,777,625 A | 10/1988 | Sakui | |
| 4,982,372 A | 1/1991 | Matsuo | |
| 5,302,843 A | 4/1994 | Yamazaki | |
| 5,731,856 A | 3/1998 | Kim et al. | |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Allison P Bernstein
(74) *Attorney, Agent, or Firm* — Eric J. Robinson; Robinson Intellectual Property Law Office, P.C.

(57) ABSTRACT

A highly integrated gain cell-type semiconductor memory is provided. A first insulator, a read bit line, a second insulator, a third insulator, a first semiconductor film, first conductive layers, and the like are formed. A projecting insulator is formed thereover. Then, second semiconductor films and a second gate insulating film are formed to cover the projecting insulator. After that, a conductive film is formed and subjected to anisotropic etching, so that write word lines are formed on side surfaces of the projecting insulator. A third contact plug for connection to a write bit line is formed over a top of the projecting insulator. With such a structure, the area of the memory cell can be 4 $F^2$ at a minimum.

14 Claims, 12 Drawing Sheets

(56) References Cited

U.S. PATENT DOCUMENTS

| | | | |
|---|---|---|---|
| 5,744,864 A | 4/1998 | Cillessen et al. | |
| 5,888,868 A | 3/1999 | Yamazaki et al. | |
| 5,977,589 A * | 11/1999 | Schloesser et al. | 257/329 |
| 6,246,083 B1 * | 6/2001 | Noble | 257/296 |
| 6,294,274 B1 | 9/2001 | Kawazoe et al. | |
| 6,504,755 B1 * | 1/2003 | Katayama et al. | 365/185.15 |
| 6,563,174 B2 | 5/2003 | Kawasaki et al. | |
| 6,574,148 B2 | 6/2003 | Chevallier | |
| 6,577,530 B2 * | 6/2003 | Muranaka et al. | 365/177 |
| 6,727,522 B1 | 4/2004 | Kawasaki et al. | |
| 6,744,087 B2 * | 6/2004 | Misewich et al. | 257/295 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,088,603 B2 | 8/2006 | Patel | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,468,901 B2 | 12/2008 | Kameshiro et al. | |
| 7,501,293 B2 | 3/2009 | Ito et al. | |
| 7,601,595 B2 * | 10/2009 | Forbes | 438/268 |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 7,772,053 B2 * | 8/2010 | Kameshiro et al. | 438/164 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |

| | | |
|---|---|---|
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0266925 A1 | 10/2008 | Lukes et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0290262 A1 | 11/2010 | Scheuerlein et al. |
| 2011/0089419 A1 | 4/2011 | Yamazaki et al. |
| 2011/0101334 A1 | 5/2011 | Yamazaki et al. |
| 2011/0114946 A1 | 5/2011 | Saito |
| 2011/0122673 A1 | 5/2011 | Kamata et al. |
| 2011/0147737 A1 | 6/2011 | Yamaxaki et al. |
| 2011/0205774 A1 | 8/2011 | Takemura |
| 2012/0193697 A1 | 8/2012 | Takemura |
| 2012/0195104 A1 | 8/2012 | Takemura |
| 2012/0199842 A1 | 8/2012 | Takemura |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-296378 | 12/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4-ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO) m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TF,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panei Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TF,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID International Symposium Digest of Technical Papers, May 31, 2009, pp. 1110-1112.

Ohara.H et al., "21.3:4.0 in. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,",

(56) References Cited

OTHER PUBLICATIONS

SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-107204-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317 , ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

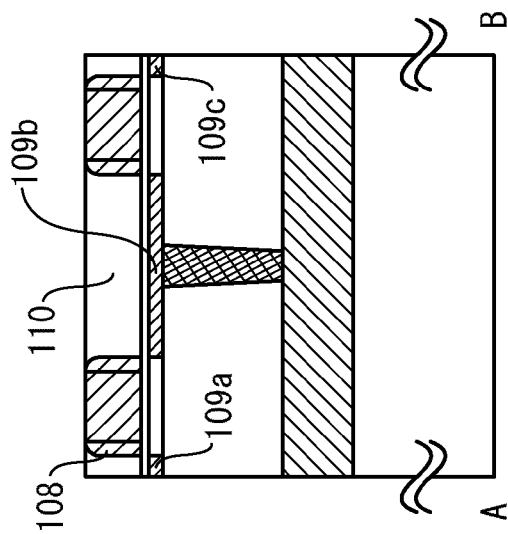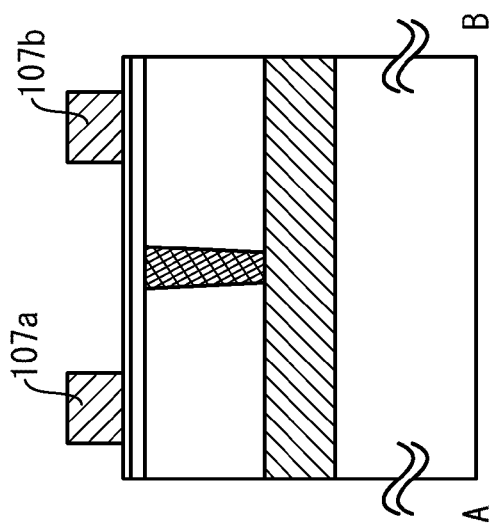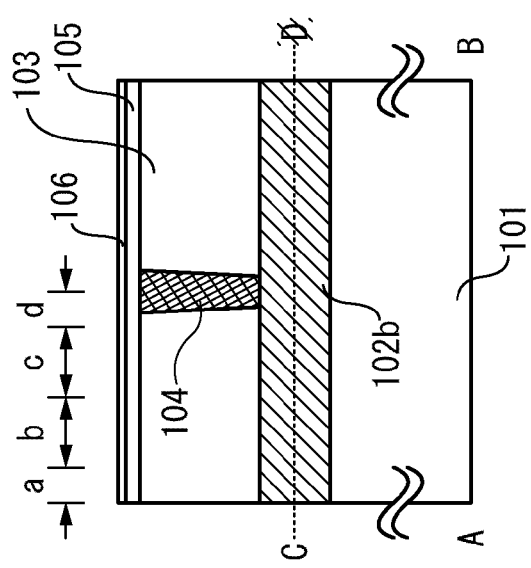

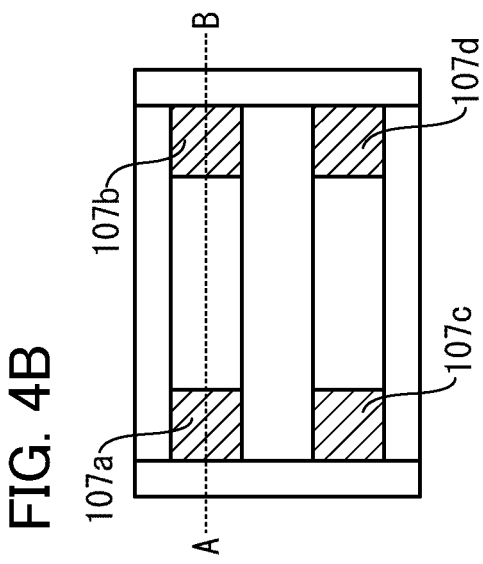
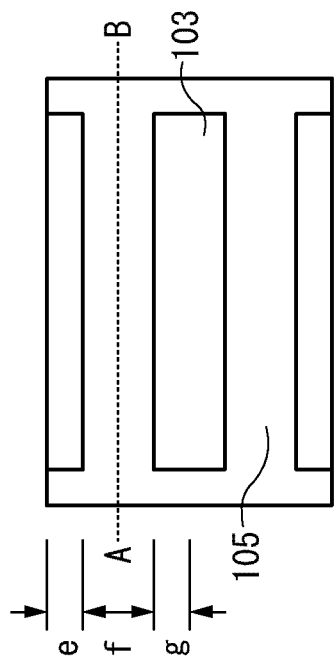
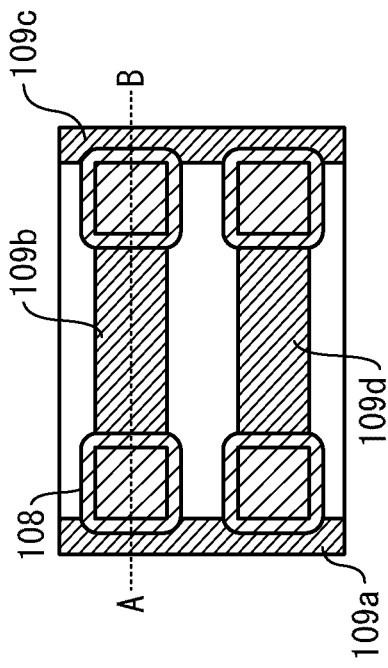

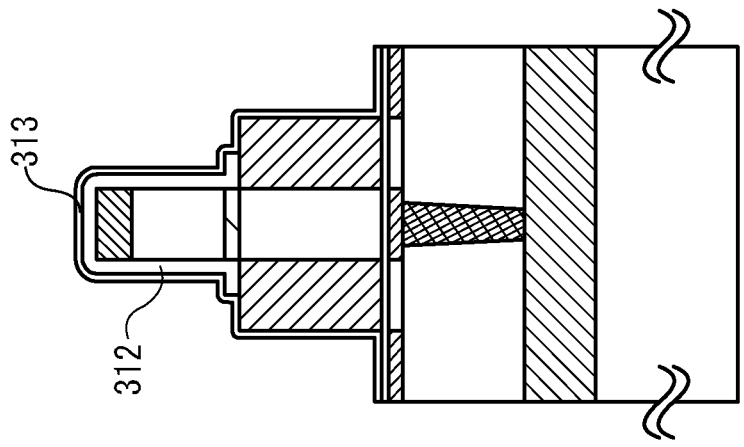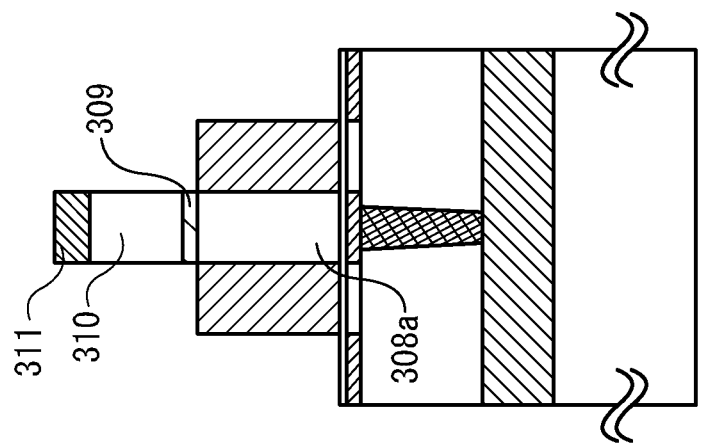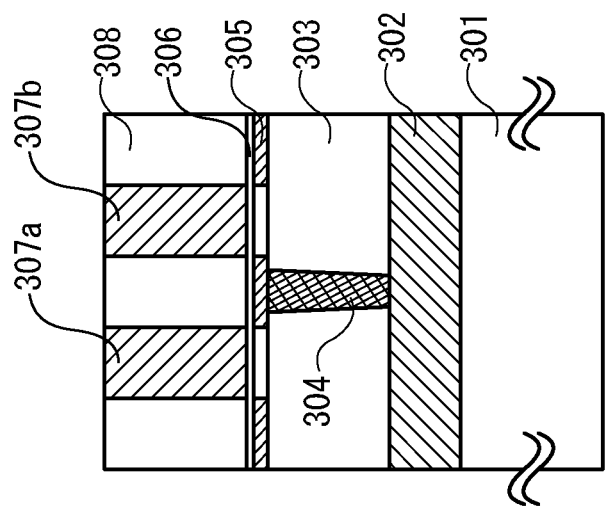

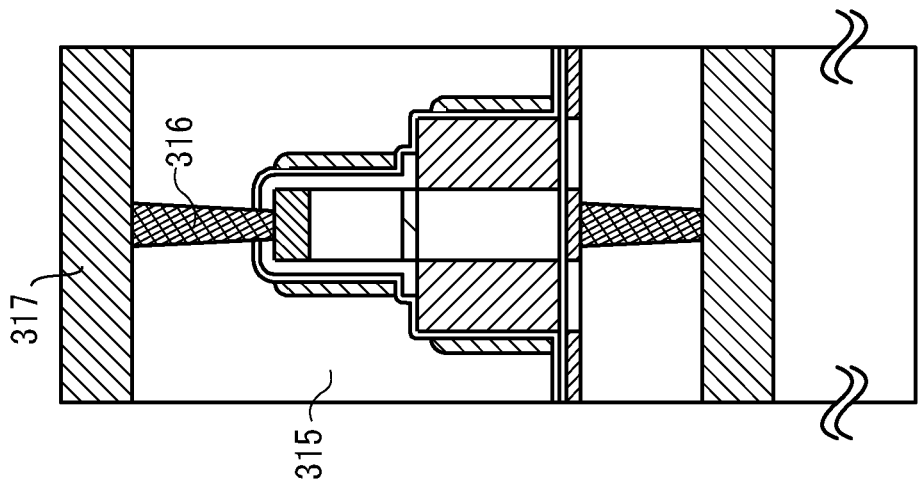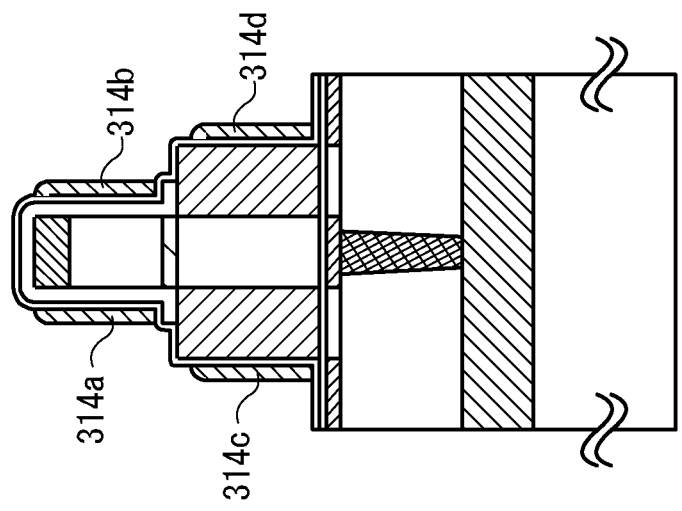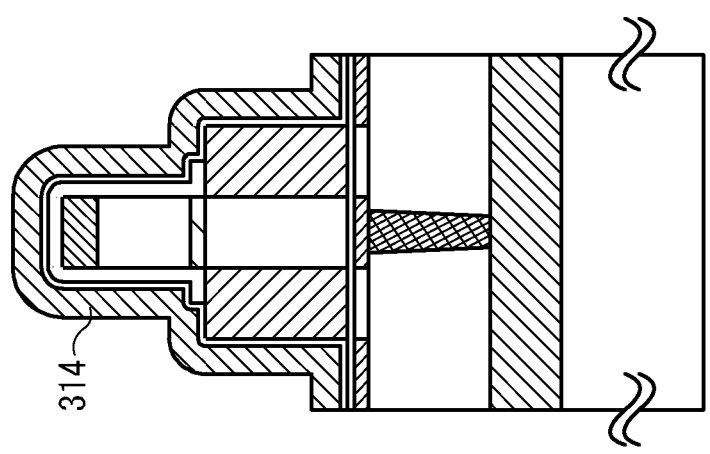

SEMICONDUCTOR MEMORY DEVICE AND METHOD MANUFACTURING SEMICONDUCTOR MEMORY DEVICE

BACKGROUND OF THE INVENTION

1. Field of the Invention

The present invention relates to a semiconductor memory device.

2. Description of the Related Art

A dynamic random access memory (1Tr-DRAM) including one capacitor and one transistor (referred to as a cell transistor) has been widely used as a typical semiconductor memory device. However, there is a requirement that the capacitance of the capacitor is not changed even when a circuit is miniaturized, and thus formation of the capacitor is becoming a major hurdle.

Under such a circumstance, a gain cell including two transistors and one capacitor (e.g., see Patent Document 1) has attracted attention as a potential solution for the problem of the conventional 1Tr-DRAM for the following reason. The capacitance of the capacitor in the 1Tr-DRAM is determined by the ratio of the capacitance of the capacitor to the parasitic capacitance of a bit line. In contrast, the capacitance of the capacitor in the gain cell is determined by the ratio of the capacitance of the capacitor to the gate capacitance of a read transistor; therefore, there arises no problem even when the capacitance of the capacitor can be reduced as the size of the transistor is reduced for miniaturization.

A circuit of the gain cell will be briefly described with reference to FIG. 1. FIG. 1 illustrates four memory cells. Among the memory cells, a memory cell including a write transistor WTr_1_1 will be described. This memory cell includes a read transistor RTr_1_1 and a capacitor in addition to the write transistor WTr_1_1.

A source of the write transistor WTr_1_1, a gate of the read transistor RTr_1_1, and one terminal of the capacitor are connected to each other, thereby forming a memory node. Further, the other terminal of the capacitor is connected to a read word line RWL_1, a gate of the write transistor WTr_1_1 is connected to a write word line WWL_1, a drain of the write transistor WTr_1_1 is connected to a write bit line WBL_1, a drain of the read transistor RTr_1_1 is connected to a read bit line RBL_1, and a source of the read transistor RTr_1_1 is connected to a common wiring CL.

Such memory cells are arranged in matrix and connected by write word lines WWL, write bit lines WBL, read word lines RWL, read bit lines RBL, common wirings CL, and the like.

REFERENCES

Patent Document

[Patent Document 1] U.S. Pat. No. 7,468,901
[Patent Document 2] U.S. Pat. No. 7,772,053
[Patent Document 3] United States Patent Application Publication No. 2011/0205774
[Patent Document 4] U.S. Pat. No. 5,302,843

SUMMARY OF THE INVENTION

However, enough consideration of an increase in the integration degree of a gain cell has not been made. Since the gain cell includes two transistors and thus needs a large area for one memory cell when the transistors are arranged in one plane, it is difficult to achieve a cell area as small as 6 $F^2$ (F is a feature size) unlike a 1Tr-DRAM.

In addition, a write transistor in the gain cell needs to have sufficiently high off-state resistance. For example, in the case where the capacitance of a capacitor is $\frac{1}{1000}$ of that of a capacitor in a 1Tr-DRAM, charges accumulated in the capacitor in the gain cell is lost 1000 times as quickly as that in the 1Tr-DRAM when the off-state resistance of the write transistor is assumed to be equal to the off-state resistance of a cell transistor in the 1Tr-DRAM. Therefore, refresh is needed 1000 times as frequently as that for the 1Tr-DRAM.

Further, when the circuit is miniaturized, the subthreshold characteristics of the write transistor deteriorate because of a short-channel effect and the off-state resistance thereof tends to decrease; no effective solutions for this problem have been proposed.

The present invention has been made in view of the above problems and its object is, for example, to provide a semiconductor memory device whose area can be reduced as much as possible, a configuration of a circuit of the semiconductor memory device, and/or a method of manufacturing the semiconductor memory device. Another object is to provide a semiconductor memory device in which the parasitic capacitance of a bit line can be reduced, a configuration of a circuit of the semiconductor memory device, and/or a method of manufacturing the semiconductor memory device. Further, another object of the present invention is to provide a highly reliable semiconductor device with excellent characteristics and/or a method of manufacturing the semiconductor device.

One mode of the present invention is a semiconductor memory device including a read bit line formed over a substrate, a first semiconductor film formed over the read bit line, a projecting insulator formed over the first semiconductor film, two write word lines that are formed on side surfaces of the projecting insulator and face each other with the insulator interposed therebetween, a second semiconductor film interposed between the write word lines and the side surfaces of the projecting insulator, an electrode provided over a top of the projecting insulator, and a write bit line that is provided over the projecting insulator and is electrically connected to the electrode.

In this specification, a read bit line may be considered as a wiring connected to a sense amplifier or another circuit, or as a wiring whose potential is amplified by a sense amplifier. A write word line may be considered as a wiring connected to a gate of a write transistor.

Here, the read bit line is preferably electrically connected to the first semiconductor film. Electrical connection means that components are connected with one or more materials having practically sufficiently low resistance interposed therebetween. Further, the height of the projecting insulator is preferably greater than or equal to 1 time and less than or equal to 20 times, further preferably greater than or equal to 2 times and less than or equal to 20 times the distance between the projecting insulator and another projecting insulator. The height of the write word line is preferably greater than or equal to 30% and less than or equal to 90%, further preferably greater than or equal to 40% and less than or equal to 80% of the height of the projecting insulator.

Another mode of the present invention is a method of manufacturing a semiconductor memory device, including the steps of forming a read bit line over a first insulator, forming a second insulator over the read bit line, forming a first contact hole in the second insulator, forming a first semiconductor film over the second insulator, forming a third insulator over the first semiconductor film, forming a projecting insulator by etching the third insulator, providing an island-shaped or stripe-shaped second semiconductor film in a region including a side surface of the projecting insulator, forming a conductive film, forming a write word line on the side surface of the projecting insulator by anisotropically etching the conductive film, forming a fourth insulator, forming a second contact hole reaching a top of the projecting insulator by etching the fourth insulator, and forming a write bit line over the fourth insulator.

In the step of etching the third insulator and the step of forming the second contact hole reaching the top of the projecting insulator, another film serving as an etching stopper may be used to control the etching.

In any of the above modes, a driver circuit such as a sense amplifier or a decoder may be provided below the read bit line. The read bit line and another read bit line adjacent thereto may be different from each other in height or depth.

In any of the above modes, a semiconductor region is preferably formed of a semiconductor with a mobility higher than or equal to 5 cm$^2$/Vs. For example, polycrystalline silicon, polycrystalline germanium, polycrystalline silicon germanium, indium oxide, an oxide obtained by adding one or more kinds of metal elements to indium oxide, gallium nitride, a compound obtained by adding oxygen to gallium nitride, gallium arsenide, indium arsenide, or zinc sulfide may be used.

Although a structure in which a gate of a transistor is provided on a side surface of a projection and/or a depression formed in a semiconductor substrate with the use of anisotropic etching is known (e.g., Patent Document 4), a preferable mode in the case of increasing the integration degree of a semiconductor memory using this structure has not been considered. Moreover, enough consideration has not been made for a preferable mode for suppression of a short-channel effect of such a transistor or a preferable application mode to a gain cell. These modes are sufficiently considered in the present invention.

By employing at least one of technical ideas disclosed in the above modes and embodiments below, the channel length of the write transistor is determined in accordance with the height of the projecting insulator. Therefore, when the height of the projecting insulator is 300 nm and the height of the write word line is 300 nm for example, the channel length of the write transistor can be 300 nm, while the channel width can be set to a feature size (e.g., 30 nm).

The on-state resistance of the write transistor is 10 times that of a planar transistor whose channel length and channel width are each 30 nm. Meanwhile, the off-state resistance of the write transistor can be, for example, greater than or equal to 1000 times, preferably greater than or equal to 10000 times that of the planar transistor as a result of suppression of a short-channel effect. Such a cell is compared with a cell of a 1Tr-DRAM. Even if the field effect mobility of the write transistor in the above mode is $\frac{1}{10}$ of the mobility of single crystal silicon used in the 1Tr-DRAM, the cell of the above mode is advantageous over the cell of the 1Tr-DRAM according to the discussion below. In this case, the write transistor has a mobility that is $\frac{1}{10}$ of that of a transistor in the 1Tr-DRAM and a channel length that is 10 times that of a transistor in the 1Tr-DRAM; therefore, the on-state resistance of the write transistor is 100 times that of the transistor in the 1Tr-DRAM.

Meanwhile, the capacitance of the capacitor in the 1Tr-DRAM is 30 fF, whereas the capacitance of the capacitor in the gain cell may be, for example, greater than or equal to one time the gate capacitance of a read transistor. Since the gate capacitance of the planar transistor whose channel length and channel width are each 30 nm is several ten attofarads (aF), the capacitance of the capacitor in the gain cell is set to 300 aF (=0.3 fF) here. That is, the capacitance (30 fF) of the capacitor in the 1Tr-DRAM is 100 times the capacitance of the capacitor in the gain cell.

On the other hand, the on-state resistance of a cell transistor in the 1Tr-DRAM is $\frac{1}{100}$ of the on-state resistance of the write transistor in the gain cell. However, time taken for writing is determined by the product of the on-state resistance and the capacitance of a capacitor; therefore, time taken for writing data into the cell of the 1Tr-DRAM is equal to that taken for the gain cell.

Note that insufficient off-state resistance requires an increase in refresh frequency and makes the gain cell impractical. The off-state resistance of the write transistor needs to be greater than or equal to 100 times the off-state resistance of the cell transistor in the 1Tr-DRAM in order to take the above advantage, otherwise the refresh frequency is higher than that of the 1Tr-DRAM.

In this respect, since owing to the mobility and channel length of the write transistor, the off-state resistance of the write transistor is 100 times the off-state resistance of the cell transistor in the 1Tr-DRAM, the refresh frequency of the gain cell can be equal to that of the 1Tr-DRAM. Moreover, the large channel length of the write transistor can suppress a short-channel effect, and thus the off-state resistance thereof is further increased. As a result, the refresh frequency becomes lower than that of the 1Tr-DRAM, and power consumption in a standby mode can be reduced.

It is obvious from the above discussion that, in a gain cell, an increase in the off-state resistance of a transistor is more important than the mobility thereof, which is certainly an important element though. In other words, the above discussion indicates that, when the ratio between on-state resistance and off-state resistance (on/off ratio=off-state resistance/on-state resistance) is a value with 10 digits or more, preferably a value with 20 digits or more, the transistor can be used as a write transistor in the gain cell whatever semiconductor material is used therein.

For example, use of a semiconductor material with which the on/off ratio becomes a value with 20 digits enables the refresh frequency to be significantly reduced; for example, it is enough to perform refresh less than or equal to once a year.

Further, more importance is placed on an increase in integration degree. The off-state resistance can be increased by increasing the channel length in general, which is a measure against miniaturization. In this respect, by employing any one of the above modes and the embodiments below, the area of the memory cell can be less than or equal to 6 F$^2$, for example, 5 F$^2$.

In any one of the above modes and the embodiments below, a projecting insulator having a high aspect ratio needs to be formed. Note that the projecting insulator has a feature which is completely different from that of a capacitor having a high aspect ratio in the 1Tr-DRAM.

A stacked capacitor or a trench capacitor is used in the 1Tr-DRAM. In the 1Tr-DRAM, the capacitor is required to have constant capacitance even when the element size is reduced. For example, when the feature size is reduced to $\frac{1}{10}$, the height or depth of the capacitor needs to be increased by 100-fold. In contrast, the height of the projecting insulator according to any one of the above modes and the embodiments below does not need to depend on the feature size.

For example, the feature size can be reduced to $\frac{1}{10}$ without changing the height of the projecting insulator. In that case, the channel width of the write transistor provided on the side surface of the projecting insulator is reduced to $\frac{1}{10}$. That is, the off-state resistance of the write transistor is increased by 10-fold. Meanwhile, although the gate capacitance of the read transistor is reduced to $\frac{1}{100}$, the capacitance of the capacitor is not necessarily proportional to the gate capacitance of the read transistor and thus can be kept at $\frac{1}{10}$ depending on the degree of miniaturization. In this case, the refresh frequency is not changed from that before miniaturization.

The height of the write word line is set to 300 nm in the above description; in an actual case, however, in consideration of process margin or the like, the height of the write word line is preferably set to be greater than or equal to 30% and less than or equal to 90%, further preferably greater than or equal to 40% and less than or equal to 80% of the height of the projecting insulator. For example, when the height of the write word line is 50% of the height of the projecting insulator, the channel length is approximately 150 nm.

In the above example, the channel length is 10 times the channel width. In such a transistor having a large channel length, variation in threshold voltage can be small in the case of using particularly a polycrystalline semiconductor material.

In the above structure, the read bit line is provided below the first semiconductor film and a component which can be an obstacle is not particularly provided in that portion, so that the depth at which the read bit line is arranged can be set as appropriate. Needless to say, the read bit line can be formed apart from the transistor (that is, in a deep position) to further reduce the parasitic capacitance. Further, the depth of one read bit line is set to be different from the depth of another read bit line adjacent thereto, whereby the parasitic capacitance generated between the adjacent read bit lines can also be reduced.

Furthermore, since the read bit line is positioned apart from the capacitor, the write word line, and the like, the parasitic capacitance between the read bit line and such components can also be reduced and signal delay can be suppressed.

By providing a circuit for driving the read bit line below the read bit line, the chip area can be reduced. In general, a driver circuit occupies 20% to 50% of a surface of a DRAM chip, which also applies to the gain cell. When the driver circuit and a memory cell array overlap with each other, the chip area can be reduced, or a larger number of memory cells can be formed than in the case of a conventional DRAM having the same chip area. The driver circuit is preferably formed using a single crystal semiconductor.

BRIEF DESCRIPTION OF THE DRAWINGS

In the accompanying drawings:

FIGS. 2A to 2C illustrate an example of a manufacturing process of a semiconductor memory device according to Embodiment 1;

FIGS. 4A to 4C illustrate an example of a manufacturing process of a semiconductor memory device according to Embodiment 1;

FIGS. 9A to 9C illustrate an example of a manufacturing process of a semiconductor memory device according to Embodiment 3;

FIGS. 10A to 10C illustrate an example of a manufacturing process of a semiconductor memory device according to Embodiment 3;

DETAILED DESCRIPTION OF THE INVENTION

Hereinafter, embodiments will be described with reference to drawings. Note that the embodiments can be implemented with various modes. It will be readily appreciated by those skilled in the art that modes and details can be changed in various ways without departing from the spirit and scope of the present invention. Thus, the present invention should not be construed as being limited to the description of the following embodiments.

In this specification, ordinal numbers such as "first" and "second" are used to avoid confusion among components and do not necessarily mean the order. For example, another insulator may be provided below a first insulator, or another contact plug may be provided between a first contact plug and a second contact plug.

In this specification, "source" and "drain" are terms referring to terminals of a transistor for distinguishing them from each other; a terminal referred to as a source in this specification may be regarded as a drain.

Embodiment 1

A manufacturing process of a memory cell according this embodiment will be described with reference to FIGS. 2A to 2C, FIGS. 3A to 3D, FIGS. 4A to 4C, FIGS. 5A to 5C, FIGS. 6A to 6C, and FIGS. 7A to 7C. FIGS. 2A to 2C, FIGS. 6A to 6C, and FIGS. 7A to 7C each illustrate a cross section parallel to a bit line in the memory cell according to this embodiment. FIGS. 4A to 4C and FIGS. 5A to 5C are schematic views each illustrating a manufacturing step in the case where the memory cell according to this embodiment is seen from the above. Note that an insulating film or the like is not illustrated in FIGS. 4A to 4C and FIGS. 5A to 5C. Cross sections along dotted line A-B in FIGS. 4A to 4C and FIGS. 5A to 5C correspond to FIGS. 2A to 2C, FIGS. 6A to 6C, and FIGS. 7A to 7C.

In this embodiment, with a few exceptions, just the outline is described. Known techniques for forming a semiconductor integrated circuit or the like may be referred to for the details. FIGS. 2A to 2C, FIGS. 6A to 6C, and FIGS. 7A to 7C will be described below in this order. Other drawings are also used as needed.

<FIG. 2A>

Figure 3A:
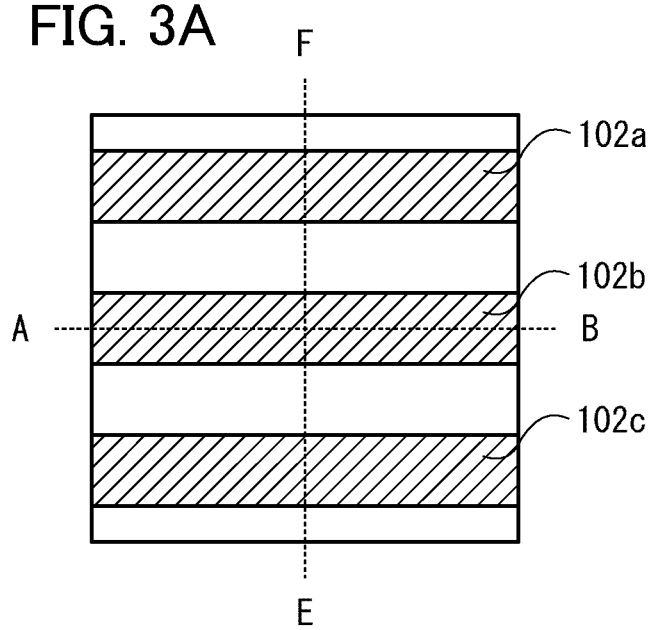
FIGS. 3A to 3D illustrate an example of a manufacturing process of a semiconductor memory device according to Embodiment 1.
Figure 3B:
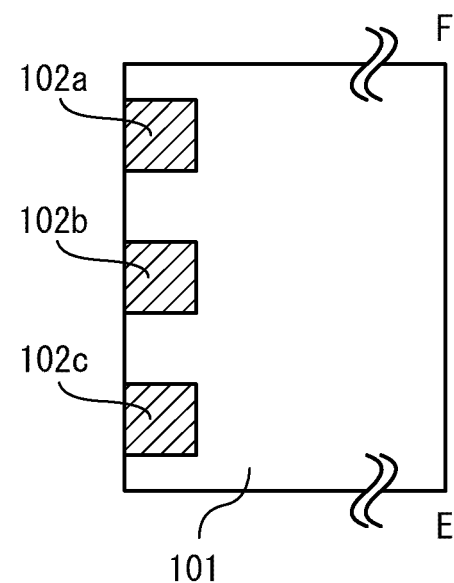

Read bit lines 102a to 102c (note that the read bit lines 102a and 102c are illustrated only in FIGS. 3A to 3D) are formed over a first insulator 101. There are some methods for arrangement of the read bit line 102b and the read bit lines 102a and 102c adjacent to the read bit line 102b. A first method is a method in which, as illustrated in FIGS. 3A and 3B, the read bit lines 102a and 102c adjacent to the read bit line 102b are formed at the same depth or in the same layer as the read bit line 102b.

FIG. 3A is a schematic view of a cross section obtained by cutting a plane in which the read bit lines 102a to 102c are formed along a plane including dotted line C-D in FIG. 2A. FIG. 3B illustrates a cross section along dotted line E-F in FIG. 3A. Note that FIG. 2A illustrates a cross section along dotted line A-B in FIGS. 3A and 3C.

As illustrated in FIG. 3B, the read bit line 102b is formed at the same depth or in the same layer as the read bit lines 102a and 102c adjacent to the read bit line 102b. This method has a feature of fewer manufacturing steps.

Figure 3C:
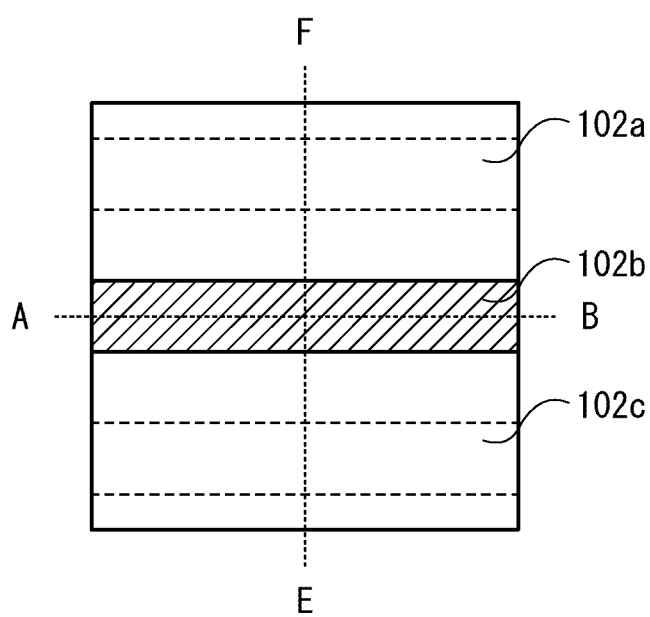
Figure 3D:
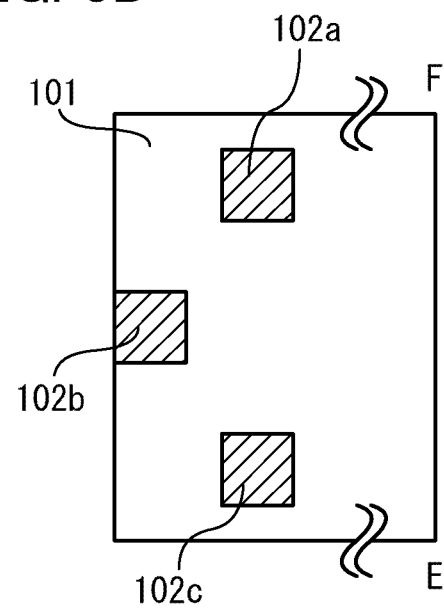

Another method is a method in which, as illustrated in FIGS. 3C and 3D, the read bit lines 102a and 102c adjacent to the read bit line 102b are formed at a depth or in a layer which is different from that of the read bit line 102b. FIG. 3C is a schematic view of a cross section taken along a plane including dotted line C-D in FIG. 2A. FIG. 3D illustrates a cross section along dotted line E-F in FIG. 3C.

As illustrated in FIG. 3D which is a cross-sectional view, the read bit lines 102a and 102c are formed at a depth which is different from that of the read bit line 102b. In FIG. 3D, the read bit lines are formed at two kinds of depths but may also be formed at three or more kinds of depths. Additional manufacturing steps are needed in this method; however, the parasitic capacitance between the adjacent read bit lines can be reduced compared with the method in which the read bit lines are formed in the same layer (FIG. 3B).

For example, the height of each of the read bit lines 102a to 102c is 5 times the width thereof and the distance between the read bit lines is equal to the width thereof; when the depth of one read bit line is different from the depth of an adjacent read bit line by the height of the read bit line as illustrated in FIG. 3D, the parasitic capacitance generated between one read bit line and another read bit line is reduced to half or less. As the height of the read bit line is increased (as the aspect ratio is increased), the effect of reducing the parasitic capacitance is improved.

When a read bit line is formed apart from a write word line, a read word line, or a capacitor as in this embodiment, most of the parasitic capacitance of the read bit line is generated between the read bit line and the other read bit lines. In particular, in order to miniaturize a wiring and reduce the resistance of the read bit line, the aspect ratio of the read bit line needs to be increased, which also increases the parasitic capacitance between the read bit lines.

Therefore, the effect of reducing the parasitic capacitance between the read bit lines by arranging the read bit lines as illustrated in FIG. 3D is advantageous. In the case where a reduction in the parasitic capacitance between the read bit lines and a reduction in the resistance of the read bit line are expected at the same time, the read bit lines are preferably arranged as illustrated in FIG. 3D. In this embodiment, any of the methods illustrated in FIGS. 3B and 3D can be employed.

In FIG. 2A, a second insulator 103 is formed over the read bit line 102b to have an appropriate thickness. The thickness and material of each of the first insulator 101 and the second insulator 103 are important to estimate the parasitic capacitance between the read bit lines. The thickness of each of the first insulator 101 and the second insulator 103 is preferably 100 nm to 1 μm. In addition, the first insulator 101 and the second insulator 103 may each be formed using a material having a relatively low permittivity such as silicon oxide.

Next, the second insulator 103 is etched to form a contact hole, and a first contact plug 104 connected to the read bit line 102b is formed. After that, a first semiconductor film 105 is formed using polycrystalline silicon, single crystal silicon, or the like to be a film having an appropriate shape. Further, a first gate insulating film 106 is formed to cover the first semiconductor film 105.

FIG. 4A is a view at this stage, which is seen from the above. Here, the first gate insulating film 106 is not illustrated. In a portion where the first semiconductor film 105 is not provided, the first gate insulating film 106 is provided in contact with the second insulator 103. In addition, the read bit lines 102a to 102c (existing below the second insulator 103) are provided in a direction along dotted line A-B (hereinafter, also referred to as a bit line direction) in the drawing so as to overlap with the first semiconductor film 105.

It is preferable to provide another semiconductor integrated circuit in a lower layer of the read bit lines 102a to 102c so as to increase the integration degree. This also applies to other embodiments. However, in general, in the case where the semiconductor integrated circuit is provided in the lower layer, noise caused by the circuit may hinder the operation of a transistor in an upper layer.

Against this problem, a shield layer may be provided below the transistor in the upper layer so as to absorb noise. In this embodiment, the read bit lines 102a to 102c are arranged to overlap with the first semiconductor film 105, so that the read bit lines 102a to 102c serve as shield layers to absorb noise.

Here, a length necessary for the memory cell will be described. Portions denoted by a and d in FIG. 2A are provided for separation between adjacent memory cells. These portions can be shared by the adjacent memory cells, and the length of each of the portions is preferably greater than or equal to 0.5 F per one cell. A portion denoted by b is a portion where a gate of a read transistor is provided. The length of this portion needs to be greater than or equal to 1 F for circuit formation, though the actual width of the gate can be smaller.

Further, a portion denoted by c is a portion where a write transistor is provided. In this embodiment, a channel of the write transistor is provided substantially perpendicularly to a substrate; therefore, the length of the portion denoted by c may be ideally 0, is preferably greater than or equal to 0.5 F in order to improve yield, and is 1 F in FIG. 2A. From the above description, when the lengths of the portions denoted by a and d are each greater than or equal to 0.5 F, the length of the memory cell needs to be greater than or equal to 2 F, preferably greater than or equal to 2.5 F. Note that the length of the memory cell is 3 F in FIG. 2A.

When the length of the portion denoted by d is reduced to be less than or equal to 0.5 F by a known resist slimming method or the like, for example, the length of the memory cell can be 2 F even if the length of the portion denoted by c is greater than 0. That is, the sum of the length of the portion denoted by d and the length of the portion denoted by c can be 0.5 F.

For example, when the length of the portion denoted by d is reduced to be 0.3 F by the resist slimming method, a length of 0.2 F can be ensured for the portion denoted by c even if the length of the portion denoted by a and the length of the portion denoted by b are set to 0.5 F and 1 F, respectively. That is, the length of the memory cell is 2 F. Note that in this case, a contact hole is formed in the portion denoted by d later, and thus a possibility of short circuit between wirings due to overetching is increased.

Next, a width of the memory cell will be described with reference to FIG. 4A. Portions denoted by e and g in FIG. 4A are provided for separation between the adjacent memory cells and each need to have a length greater than or equal to 0.5 F. A portion denoted by f is a portion where the gate of the read transistor is provided and needs to have a length greater than or equal to 1 F.

Particularly in the case where the gate of the read transistor is processed in a general photolithography step, the length of the portion denoted by f needs to be greater than or equal to 2 F in consideration of misalignment; in the case of employing a special manufacturing method according to this embodiment, the length of the portion denoted by f can be 1 F. Thus, the width of the memory cell needs to be greater than or equal to 2 F. Accordingly, the area of the memory cell is 4 $F^2$ at a minimum, and is preferably greater than or equal to 5 $F^2$ in consideration of yield and the like.

<FIG. 2B>

First conductive layers 107a to 107d (note that the first conductive layers 107c and 107d are illustrated only in FIG. 4B) serving as gates of read transistors are formed over the first gate insulating film 106. The material and thickness of each of the first conductive layers 107a to 107d may be set as appropriate but are preferably set to be suitable for the following process. For example, polycrystalline silicon may be used.

FIG. 4B is a view at this stage, which is seen from the above. In practice, the processing accuracy of the first conductive layers 107a to 107d is substantially equal to the processing accuracy of the first semiconductor film 105; thus, the first conductive layers 107a to 107d might imperfectly divide the first semiconductor film 105 because of misalignment. In order to avoid such a problem, the length of each of the first conductive layers 107a to 107d in a direction perpendicular to dotted line A-B (hereinafter, also referred to as a word line direction) in FIG. 4B may be set to 2 F. In this embodiment, however, that problem can be overcome even when the length is 1 F, by employing the method described below.

<FIG. 2C>

A first conductive film having an appropriate thickness is formed to cover the first conductive layers 107a to 107d. The first conductive film may be formed using a material which is the same as or different from that for the first conductive layers 107a to 107d. Then, the first conductive film is subjected to anisotropic etching, so that sidewalls 108 are formed on side surfaces of the first conductive layers 107a to 107d. The width of each of the sidewalls 108 is preferably 0.1 F to 0.3 F. In this manner, the above-described memory cell width of 2 F can be attained.

Note that application of this technique is not limited to application to this embodiment and the gain cell. Each of the first conductive layers 107a to 107d also corresponds to a floating gate of a flash memory or the like, and application of this technique thereto contributes to miniaturization of the memory cell.

Further, the first semiconductor film 105 is doped with an impurity with the use of the first conductive layers 107a to 107d and the sidewalls 108 on the side surfaces thereof as masks, so that n-type or p-type impurity regions 109a to 109d (the impurity region 109d is illustrated only in FIG. 4C) are formed. Then, a third insulator 110 is formed. A surface of the third insulator 110 is planarized so that top surfaces of the first conductive layers 107a to 107d are exposed.

FIG. 4C is a view of the memory cell at this stage, which is seen from the above. The first conductive layers 107a to 107d and the sidewalls 108 on the side surfaces thereof are formed, and serve as the gates of the read transistors. Since the provision of the sidewalls 108 enables the gates of the read transistors to cross the first semiconductor film 105 completely, the impurity region 109a (or 109c) can be completely separated from the impurity region 109b/109d even if some misalignment is caused in the formation of the first conductive layers 107a to 107d.

As illustrated in FIG. 4C, conductive regions including the first conductive layers 107a to 107d and the sidewalls 108 on the side surfaces thereof each have a square shape with rounded corners when seen from the above, and the length of one side of the square is greater than 1 F.

Further, the impurity regions 109a and 109c extend in the word line direction. In this embodiment, the impurity regions 109a and 109c are used as part of common wirings. Note that for an increase in conductivity, it is preferable that a silicide be formed on surfaces of the impurity regions 109a to 109d by a known salicide (self-aligned silicide) technology so that the resistance is reduced. Alternatively, a wiring having low resistance may be provided, in the word line direction, between the first semiconductor film 105 and the second insulator 103 or between the first semiconductor film 105 and the read bit lines 102a to 102c.

<FIG. 6A>

A fourth insulator, a fifth insulator, and a second conductive film are each formed to have an appropriate thickness. The fourth insulator is preferably formed using a material whose etching rate is different from that of the material for the fifth insulator formed over the fourth insulator, e.g., aluminum oxide, aluminum nitride, or silicon nitride with a thickness of 10 nm to 100 nm. In the case where an oxide semiconductor is used for second semiconductor films 114a and 114b formed later, the fourth insulator is preferably formed using a material having a barrier property against hydrogen.

The thickness of the fifth insulator is determined in consideration of the height of a projecting insulator 112 formed later and the channel length of a write transistor, and is 100 nm to 1 μm for example. In addition, the fifth insulator is preferably formed using a material whose etching rate is different from that of the material for the fourth insulator, and silicon oxide may be used. In addition, the material and thickness of the second conductive film may be set as appropriate and are preferably those which can provide a function of an etching stopper when a third contact plug 124 is formed later.

The second conductive film and the fifth insulator are etched, so that the projecting insulator 112 and a second conductive layer 113 thereover are formed. This etching is stopped when a surface of the fourth insulator is exposed. Since the etching rates of the fourth insulator and the fifth insulator are different from each other, the fourth insulator can be used as an etching stopper; thus, overetching of the lower layer can be prevented. After that, the fourth insulator is etched. The fourth insulator becomes a fourth insulating layer 111.

At this stage, the projecting insulator 112, the second conductive layer 113, and the fourth insulating layer 111 extend substantially in the word line direction. FIG. 5A illustrates this state seen from the above. Note that when the height of the projecting insulator 112 is denoted by H and the distance between the projecting insulator 112 and an adjacent projecting insulator (not shown) is denoted by W, the ratio H/W is preferably greater than or equal to 1 and less than or equal to 20, further preferably greater than or equal to 5 and less than or equal to 20.

<FIG. 6B>

Figure 5B:
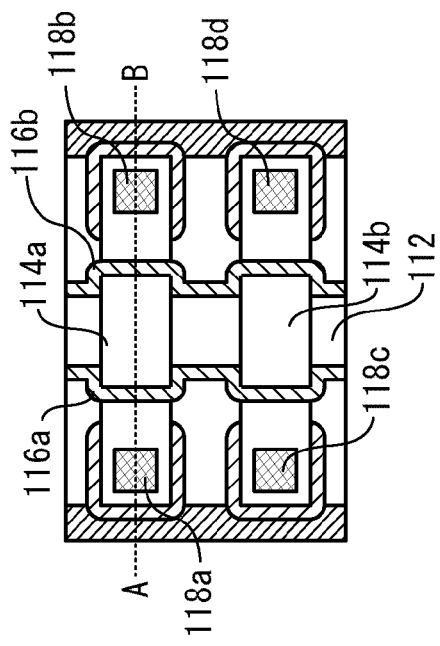
FIGS. 5A to 5C illustrate an example of a manufacturing process of a semiconductor memory device according to Embodiment 1.
Figure 5A:
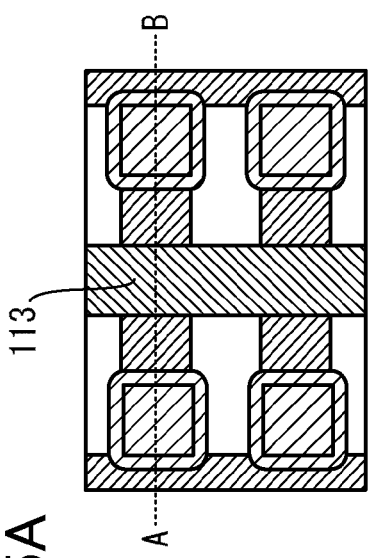

The island-shaped second semiconductor films 114a and 114b (note that the second semiconductor film 114b is illustrated only in FIG. 5B) are formed. The second semiconductor films 114a and 114b are in contact with the first conductive layers 107a to 107d.

Figure 6C:
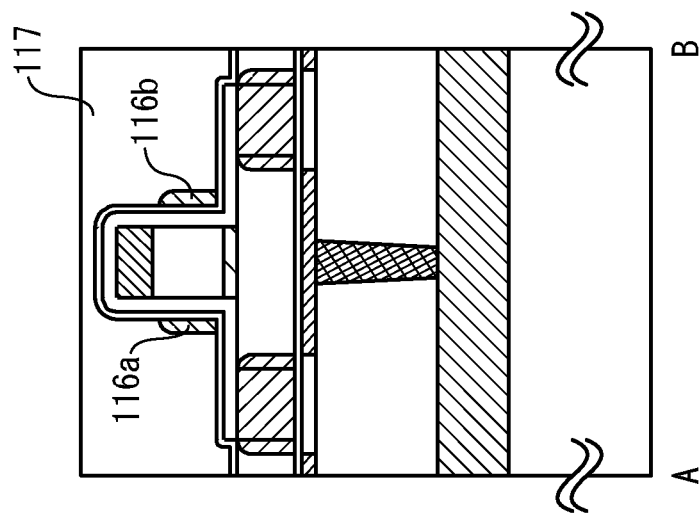
FIGS. 6A to 6C illustrate an example of a manufacturing process of a semiconductor memory device according to Embodiment 1.
Figure 6B:
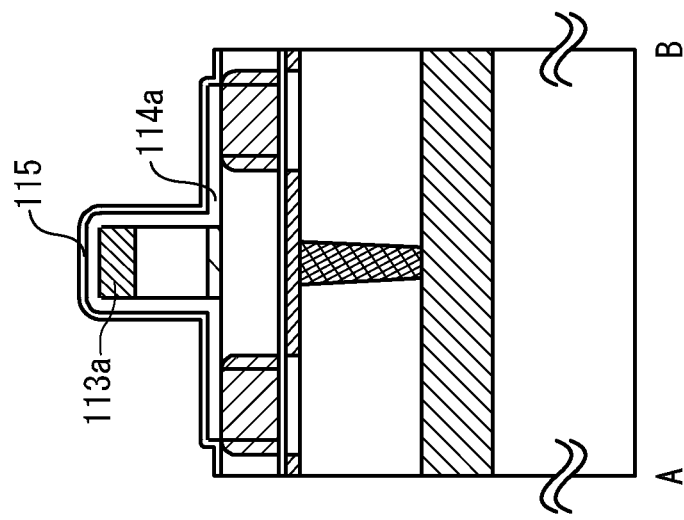
Figure 6A:
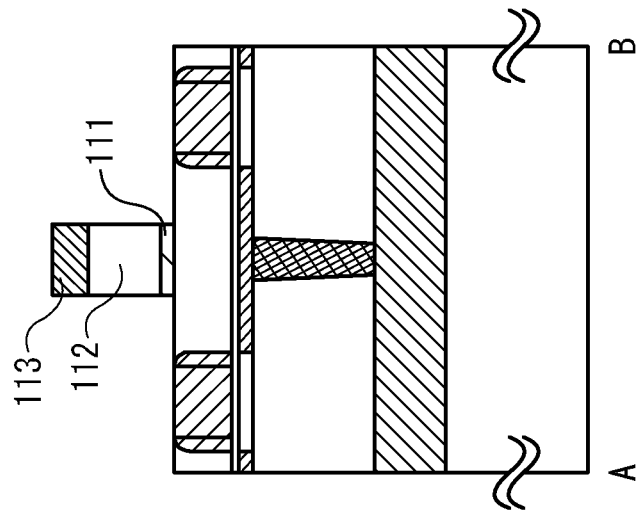
Figure 7A:
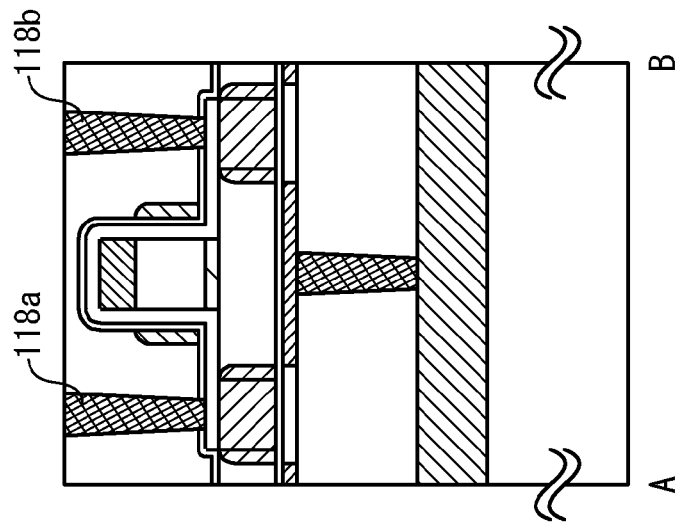
FIGS. 7A to 7C illustrate an example of a manufacturing process of a semiconductor memory device according to Embodiment 1.
Figure 7B:
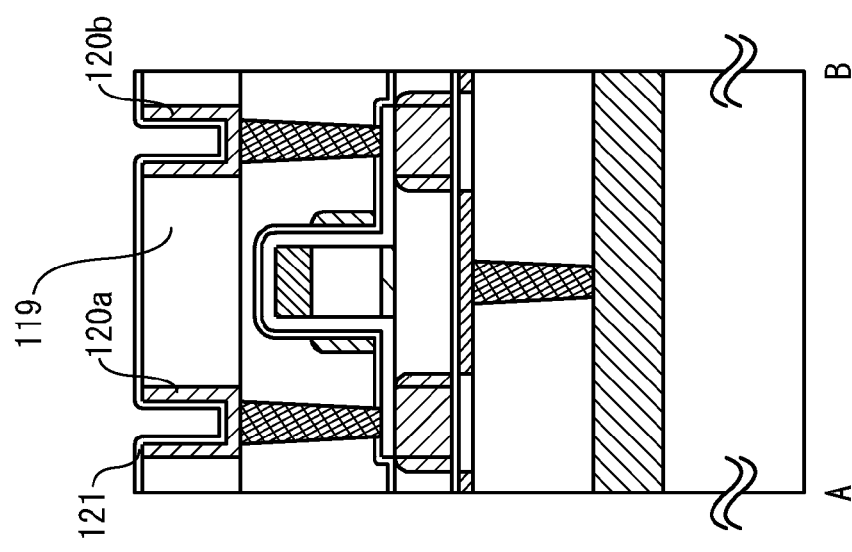
Figure 7C:
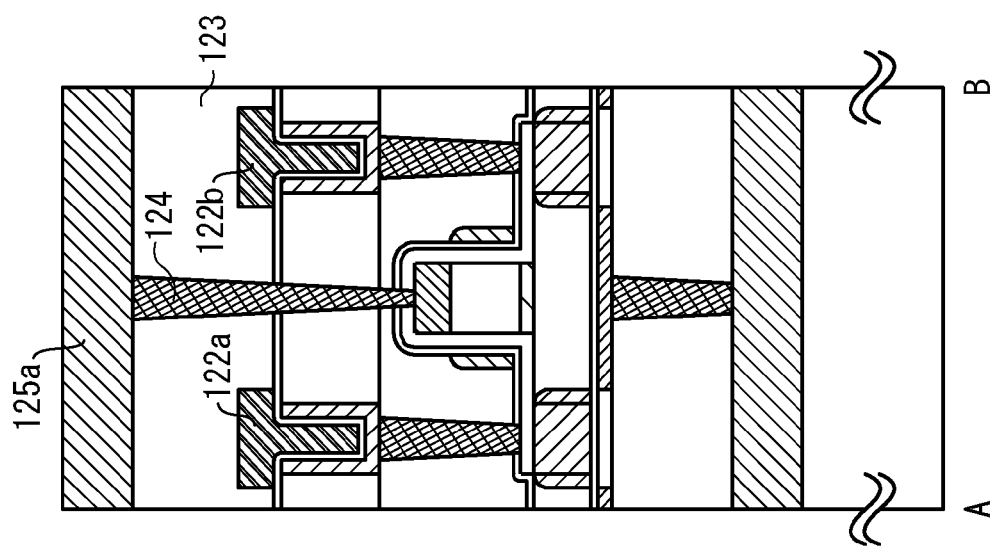

At this time, the second conductive layer 113 is also etched using the second semiconductor films 114a and 114b as masks. Accordingly, a portion in the second conductive layer 113 over which the second semiconductor films 114a and 114b are not provided is removed. As illustrated in FIG. 6B, part of the second conductive layer 113 remains to become a second conductive layer 113a. After that, a second gate insulating film 115 is formed to cover the second semiconductor films 114a and 114b.

The thicknesses of the second semiconductor films 114a and 114b and the second gate insulating film 115 can be determined as appropriate but are preferably determined in accordance with the channel length of the transistor or the distance W between the projecting insulators, for example, may be set to 1/50 to 1/5 of the channel length or 1/10 to 1/50 of the distance W between the projecting insulators. Note that the second gate insulating film 115 may be thinned to such a level that a tunneling current or the like does not cause a problem. In addition, the second gate insulating film 115 may be formed using a material whose relative permittivity is greater than or equal to 10.

The second gate insulating film 115 may be formed using a material whose etching rate is different from that of a material used for write word lines 116a and 116b formed later or a material used for a sixth insulator 117. In such a sense, hafnium oxide, tantalum oxide, aluminum oxide, zirconium oxide, or the like may be used. The second gate insulating film 115 may also be a multilayer film including any of the above materials. For example, a two-layer film including silicon oxide and aluminum oxide may be used.

There is no limitation on the kind of a semiconductor used for the second semiconductor films 114a and 114b but the mobility thereof is preferably higher than or equal to 5 $cm^2$/Vs. For example, polycrystalline silicon, polycrystalline germanium, polycrystalline silicon germanium, indium oxide, an oxide obtained by adding a metal element to indium oxide, gallium nitride, a compound obtained by adding oxygen to gallium nitride, gallium arsenide, indium arsenide, or zinc sulfide may be used.

In particular, in the case where the capacitance of the capacitor is reduced, the off-state resistance needs to be higher than that of a cell transistor in a 1Tr-DRAM. In order to increase the off-state resistance, for example, it is effective to significantly reduce the thickness of each of the second semiconductor films 114a and 114b to 0.5 nm to 5 nm. Further, it is also preferable to increase the height of the projecting insulator (or the channel length of the write transistor). Alternately, when the original mobility is higher than or equal to 200 $cm^2$/Vs as in the case of polycrystalline silicon, the mobility may be reduced to approximately 10 $cm^2$/Vs by increasing the nitrogen concentration or the carbon concentration of the semiconductor region to $1\times10^{19}$ $cm^{-3}$ to $5\times10^{20}$ $cm^{-3}$.

It is preferable to further increase the off-state resistance of the write transistor because the refresh interval of the memory cell can be lengthened. For example, when the off-state resistance is million times or more that of a general cell transistor in a 1Tr-DRAM, the memory cell can be used practically without refresh operation.

In order to obtain such a very high off-state resistance, silicon (whose band gap is 1.1 eV) is inadequate. It is necessary to use a wide band gap semiconductor whose band gap is greater than or equal to 2.5 eV and less than or equal to 4 eV, preferably greater than or equal to 3 eV and less than or equal to 3.8 eV. For example, an oxide semiconductor such as indium oxide or zinc oxide, a nitride semiconductor such as gallium nitride, or a sulfide semiconductor such as zinc sulfide may be used.

The off-state resistance is inversely proportional to the concentration of carriers excited by heat. Since the band gap of silicon is 1.1 eV even when carriers caused by donors or acceptors do not exist at all (intrinsic semiconductor), the concentration of carriers excited by heat at room temperature (300 K) is approximately $1\times10^{11}$ $cm^{-3}$.

On the other hand, in the case of a semiconductor whose band gap is 3.2 eV, the concentration of carriers excited by heat is approximately $1\times10^{-7}$ $cm^{-3}$. When the electron mobility is the same, the resistivity is inversely proportional to the carrier concentration, so that the resistivity of the semiconductor whose band gap is 3.2 eV is 18 orders of magnitude higher than that of silicon.

It is preferable that the concentration of carriers caused by donors or acceptors be as low as possible, e.g., lower than or equal to $1\times10^{12}$ $cm^{-3}$. The threshold voltage of the transistor depends on the concentration of carriers caused by donors or acceptors. Patent Document 3 can be referred to for such a wide band gap semiconductor.

<FIG. 6C>

A third conductive film is formed and subjected to anisotropic etching to form the write word lines 116a and 116b. The width of each of the write word lines 116a and 116b substantially equals to the thickness of the third conductive film. Patent Document 4 may be referred to for a technique for forming a wiring at a side surface of the projecting insulator in a self-aligned manner as described above. Further, the sixth insulator 117 which has a flat surface is formed.

In the case where a top of the write word line 116a and a top of the write word line 116b are positioned at a higher level than a top of the projecting insulator 112 (or at substantially the same level as the second conductive layer 113a), the write word lines 116a and 116b might be in contact with the third contact plug 124 which is formed later. Therefore, the height of each of the write word lines 116a and 116b is preferably greater than or equal to 30% and less than or equal to 90%, further preferably greater than or equal to 40% and less than or equal to 80% of the height of the projecting insulator 112.

Through the above, the second conductive layer 113a and the write word lines 116a and 116b may be in an offset state (a state where the second conductive layer 113a and the write word lines 116a and 116b do not overlap with each other). In order to prevent a short-channel effect, it is preferable to provide an offset region (a portion where the second conductive layer 113a and the write word lines 116a and 116b do not overlap with each other) which is 10 nm to 50 nm long in the perpendicular direction or has a length that is 20% to 100% of the height of each of the write word lines 116a and 116b.

Note that the drawing illustrates the case where the write word lines 116a and 116b and the first conductive layers 107a to 107d are in an offset state; in the case where the integration degree is increased so that the length of the portion denoted by c in FIG. 2A becomes 0, the write word lines 116a and 116b overlap with the first conductive layers 107a to 107d inevitably.

Such a state might lead to an unnecessary change in potential in charging of the capacitor. However, in the case where the aspect ratio of each of the write word lines 116a and 116b is greater than or equal to 5 and less than or equal to 20, the parasitic capacitance generated between the write word lines 116a and 116b and the first conductive layers 107a to 107d is approximately 20% of gate capacitance (capacitance caused by overlapping of the write word lines 116a and 116b with the second semiconductor films 114a and 114b) at most, which is ignorable when the capacitance of the capacitor is set to be twice or more of the gate capacitance.

Further, an impurity may be implanted into the second semiconductor films 114a and 114b with the use of the write word lines 116a and 116b as masks by an ion implantation method or the like to form an n-type or p-type region (doped region). In the case where the distances from portions where the first conductive layers 107a to 107d are in contact with the second semiconductor films 114a and 114b to the write word lines 116a and 116b are each less than or equal to 30 nm, preferably less than or equal to 10 nm, the doped region is not necessarily formed.

Further, the doped region is not necessarily formed either, in the case where the second semiconductor films 114a and 114b have any conductivity type from the beginning and the transistor can be controlled by utilizing a difference in work function between the semiconductor material for the second semiconductor films 114a and 114b and the material for the write word lines 116a and 116b. For example, polycrystalline silicon over silicon oxide has n-type conductivity even when it is not doped with impurities; electrons are removed by using a material having a work function higher than or equal to 5 eV such as indium nitride, zinc nitride, or p-type silicon for the write word lines 116a and 116b, so that an n-channel transistor whose threshold voltage is higher than or equal to +1 V can be formed.
<FIG. 7A>

The sixth insulator 117 is etched so that contact holes are formed, and second contact plugs 118a to 118d (note that the second contact plugs 118c and 118d are illustrated only in FIG. 5B) are embedded therein.

FIG. 5B is a view at this stage, which is seen from the above. Note that the second gate insulating film 115 is not illustrated in FIG. 5B. The second conductive layer 113a exists under a portion which is in the second semiconductor film 114a and interposed between the write word line 116a and the write word line 116b. Further, in a portion which is interposed between the write word line 116a and the write word line 116b and covered with none of the second semiconductor films 114a and 114b, the projecting insulator 112 is exposed. That is, the second conductive layer 113a is isolated.
<FIG. 7B>

A seventh insulator 119 is formed using a material having a relatively low permittivity such as silicon oxide or silicon oxycarbide. Holes are formed in the seventh insulator 119 to form capacitors therein. Then, capacitor electrodes 120a and 120b each having a thickness of 2 nm to 20 nm are formed on inner walls of the holes. The maximum thickness of each of the capacitor electrodes 120a and 120b may be determined in accordance with the feature size F. The thickness is preferably less than or equal to 5 nm when F is 20 nm, and the thickness is preferably less than or equal to 2.5 nm when F is 10 nm.

Further, a capacitor insulator 121 having a thickness of 2 nm to 20 nm is formed. The capacitor insulator 121 can be formed using any of various high-k materials, preferably hafnium oxide, zirconium oxide, tantalum oxide, barium strontium titanate, or the like.
<FIG. 7C>

Read word lines 122a and 122b are formed in the word line direction. The capacitor electrode 120a (or 120b), the capacitor insulator 121, and the read word line 122a (or 122b) form a capacitor.

Further, an eighth insulator 123 is formed, and the third contact plug 124 is embedded therein. The seventh insulator 119 and the eighth insulator 123 are sufficiently thick; thus, when misalignment of a mask and excessive etching occur at the same time, a contact hole could be connected to the write word line 116a or 116b. Such a problem is likely to be caused in the case where the integration degree is high and the width of the top of the projecting insulator 112 is processed at a feature size.

In order to avoid such a problem, it is preferable that the second conductive layer 113a be sufficiently thick and the tops of the write word lines 116a and 116b be positioned at a sufficiently lower level than a top of the second conductive layer 113a. In that case, the second conductive layer 113a is preferably formed using a material which functions as an etching stopper.

Figure 1:
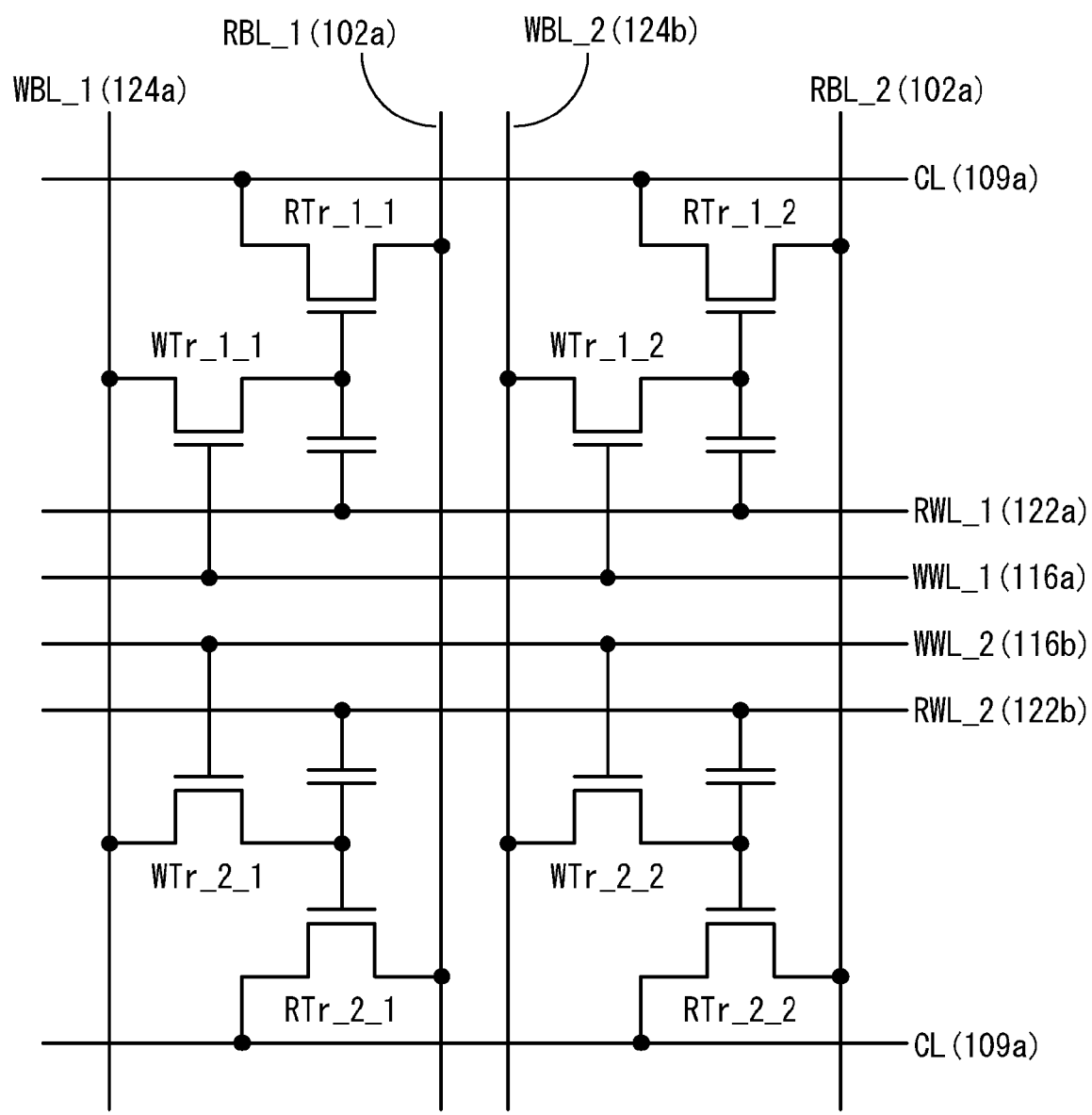
FIG. 1 illustrates an example of a circuit of a semiconductor memory device according to Embodiment 1.
Figure 5C:
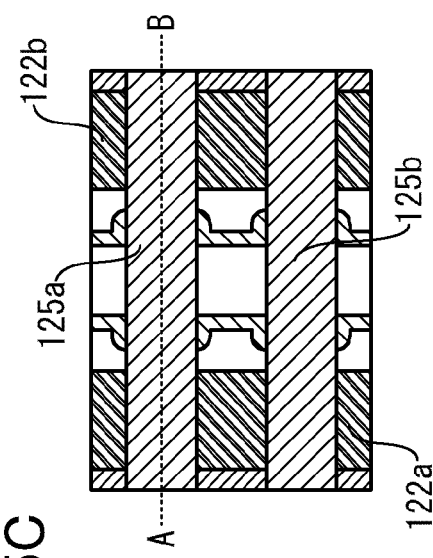

Then, write bit lines 125a and 125b (note that the write bit line 125b is illustrated only in FIG. 5C) are formed in the bit line direction. In this manner, gain memory cells each including two transistors and one capacitor can be manufactured. FIG. 5C is a view at this stage, which is seen from the above. Note that the eighth insulator 123 is not illustrated in FIG. 5C. A circuit diagram of this embodiment corresponds to FIG. 1.

Embodiment 2

Figure 8:
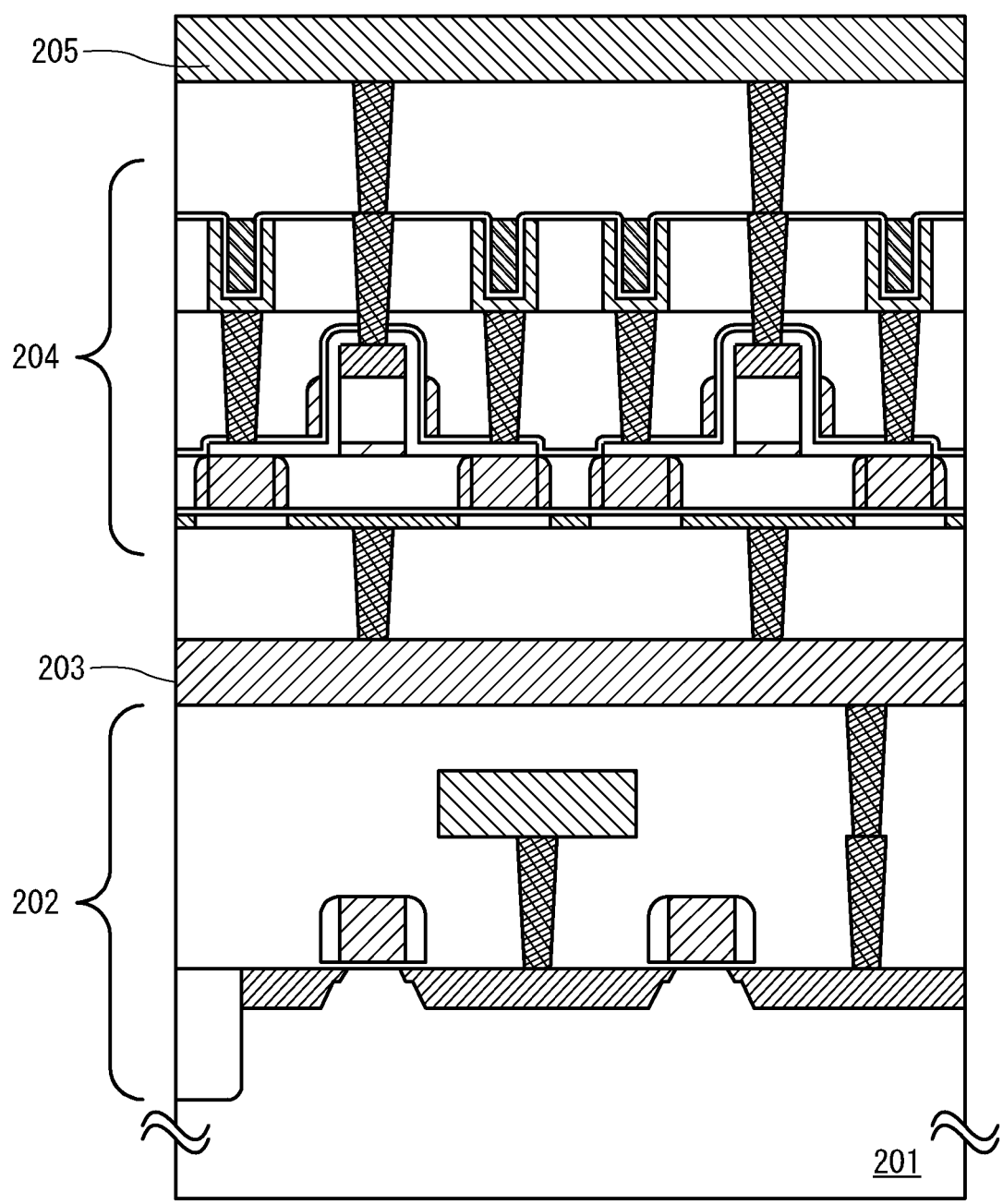
FIG. 8 illustrates an example of a structure of a semiconductor memory device according to Embodiment 2.

This embodiment will be described with reference to FIG. 8. In this embodiment, a circuit (a driver circuit 202) for driving a memory cell, such as a sense amplifier or a decoder, is formed on a surface of a substrate 201 of a single crystal semiconductor by known techniques for forming a semiconductor integrated circuit. A read bit line 203 is formed over the driver circuit 202, and a memory cell layer 204 including a write word line and a read word line is provided over the read bit line 203. Further, a write bit line 205 is formed over the memory cell layer 204.

Embodiment 3

A manufacturing process of a memory cell according this embodiment will be described with reference to FIGS. 9A to 9C and FIGS. 10A to 10C. FIGS. 9A to 9C and FIGS. 10A to 10C are cross-sectional views illustrating the manufacturing process of the memory cell according to this embodiment. In this embodiment, with a few exceptions, just the outline is described. Embodiment 1, known techniques for forming a semiconductor integrated circuit, or the like may be referred to for the details. FIGS. 9A to 9C and FIGS. 10A to 10C will be described below in this order.
<FIG. 9A>

A read bit line 302 is formed over a first insulator 301. Further, a second insulator 303 is formed over the read bit line 302 to have an appropriate thickness. The thickness of each of the first insulator 301 and the second insulator 303 is preferably 100 nm to 1 µm. In addition, the first insulator 301 and the second insulator 303 may each be formed using a material having a relatively low permittivity such as silicon oxide.

Next, the second insulator 303 is etched to form a contact hole, and a first contact plug 304 connected to the read bit line 302 is formed. After that, a first semiconductor film 305 is formed using polycrystalline silicon, single crystal silicon, or the like to be a film having an appropriate shape. Further, a first gate insulating film 306 is formed to cover the first semiconductor film 305.

First conductive layers 307a and 307b serving as gates of read transistors are formed over the first gate insulating film 306. As in Embodiment 1, sidewalls may be provided on side surfaces of the first conductive layers 307a and 307b with the use of a conductive material. Further, an impurity region may be provided in the first semiconductor film 305 with the use of the first conductive layers 307a and 307b as masks. Then, a third insulator 308 is formed. A surface of the third insulator 308 is planarized so that top surfaces of the first conductive layers 307a and 307b are exposed.

<FIG. 9B>

The third insulator 308 is partly etched to form a third insulator 308a. At this time, a portion interposed between the first conductive layers 307a and 307b is left. Further, a fourth insulator, a fifth insulator, and a second conductive film are each formed to have an appropriate thickness. For the fourth insulator, the fifth insulator, and the second conductive film, the fourth insulator, the fifth insulator, and the second conductive film in Embodiment 1 may be referred to.

Through etching, a fourth insulating layer 309 is processed from the fourth insulator, and a projecting insulator 310 and a second conductive layer 311 are formed. As in Embodiment 1, at this stage, the projecting insulator 310, the second conductive layer 311, and the fourth insulating layer 309 extend substantially in the word line direction.

<FIG. 9C>

An island-shaped second semiconductor film 312 is formed. The second semiconductor film 312 is in contact with the first conductive layers 307a and 307b. At this time, the second conductive layer 311 is also etched using the second semiconductor film 312 as a mask. Accordingly, a portion in the second conductive layer 311 over which the second semiconductor film 312 is not provided is removed.

After that, a second gate insulating film 313 is formed to cover the second semiconductor film 312, the first conductive layers 307a and 307b, and the first gate insulating film 306.

For the second semiconductor film 312 and the second gate insulating film 313, the second semiconductor films 114a and 114b and the second gate insulating film 115 in Embodiment 1 may be referred to, respectively.

<FIG. 10A>

A third conductive film 314 is formed to cover the second gate insulating film 313.

<FIG. 10B>

The third conductive film 314 is subjected to anisotropic etching, so that third conductive layers 314a to 314d are formed. The third conductive layers 314a to 314d are formed in the word line direction along the projecting insulator 310, the first conductive layers 307a and 307b, and the third insulator 308a.

Thus, the third conductive layers 314a and 314b serve as write word lines. The third conductive layers 314c and 314d form capacitors with the first conductive layers 307a and 307b, respectively, with the second gate insulating film 313 used as a dielectric (capacitor insulator), and serve as read word lines.

<FIG. 10C>

A sixth insulator 315 is formed and etched so that a contact hole reaching the second conductive layer 311 is formed, and a second contact plug 316 is embedded therein. Further, a write bit line 317 is formed in the bit line direction. In this manner, gain memory cells each including two transistors and one capacitor can be manufactured. The area of the memory cell according to this embodiment can also be 4 $F^2$ at a minimum.

The memory cell according to this embodiment has a simple structure and is manufactured by fewer steps as compared with the memory cell in Embodiment 1. Moreover, the first conductive layer 307a and the third conductive layer 314c (or the first conductive layer 307b and the third conductive layer 314d) form the capacitor of the memory cell. The capacitance of the capacitor is determined in accordance with the height of the first conductive layer 307a (or the first conductive layer 307b).

Embodiment 4

A manufacturing process of a memory cell according this embodiment will be described with reference to FIGS. 11A to 11C and FIGS. 12A and 12B. FIGS. 11A to 11C and FIGS. 12A and 12B are cross-sectional views illustrating the manufacturing process of the memory cell according to this embodiment, along line G-H and line I-J. Line G-H and line I-J cross each other perpendicularly at the point X. Line G-H is parallel to bit lines and line I-J is parallel to word lines. Thus, the direction of line G-H and the direction of line I-J are also called the bit line direction and the word line direction, respectively.

In this embodiment, with a few exceptions, just the outline is described. The above embodiments, known techniques for forming a semiconductor integrated circuit, or the like may be referred to for the details. FIGS. 11A to 11C and FIGS. 12A and 12B will be described below in this order.

<FIG. 11A>

Device isolation insulators 402 are formed in a semiconductor substrate 401. Single crystal silicon may be used for the semiconductor substrate 401. Further, a first gate insulating film 403 and a first conductive layer 404 are formed. The first conductive layer 404 is a memory node of the memory cell, and formed so as cross a region between two device isolation insulators 402. Further, impurity regions 405 are formed by a self-aligned method using the first conductive layer 404 as a mask.

A transistor is formed where the first conductive layer 404 is the gate and the first gate insulating film 403 is the gate insulating film. This transistor functions as a read transistor. Further, the impurity regions 405 are extended in the bit line direction and at least one of them functions as a read bit line.

Further, a first insulator 406 is provided so as to cover the upper surface, the side face toward I and the side face toward J of the first conductive layer 404. Second conductive layers 408 are formed at the side faces toward G and H where a second insulator 407 is interposed therebetween. The first conductive layer 404 and the second conductive layers 408 form capacitors, where the second insulator 407 is a dielectric. The second conductive layers 408 are formed by an anisotropic etching method as shown in Embodiment 3. Note that the second conductive layers 408 function as read word lines.

The first conductive layer 404 may be formed as follows. First, a conductive film for forming the first conductive layer 404 is formed over the first gate insulating film 403, and is patterned in line shape that is long in the bit line direction. Then the impurity regions 405 are formed by implantation of impurity ions.

Next, an insulating film which is for forming the first insulator 406 is formed and its surface is flattened. The insulating film is selectively etched to the surface of the semiconductor substrate 401 and is patterned in line shape long along the word line direction. As a result, the first conductive layer 404 is rectangular (or square) when seen from the above.

Then, the second insulator 407 is formed. Further, a conductive film which is for forming the second conductive layers 408 is formed and is anisotropically etched, so the second conductive layers 408 are formed on the side faces of the first conductive layer 404 (and the side faces of the first insulator 406). As a result, the second conductive layers 408 are extended in the word line direction.

<FIG. 11B>

Figure 11A:
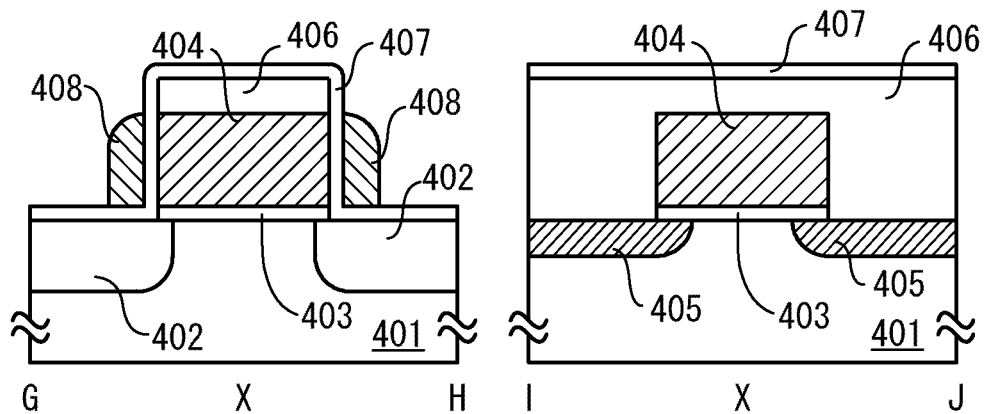
FIGS. 11A to 11C illustrate an example of a manufacturing process of a semiconductor memory device according to Embodiment 4.
Figure 11B:
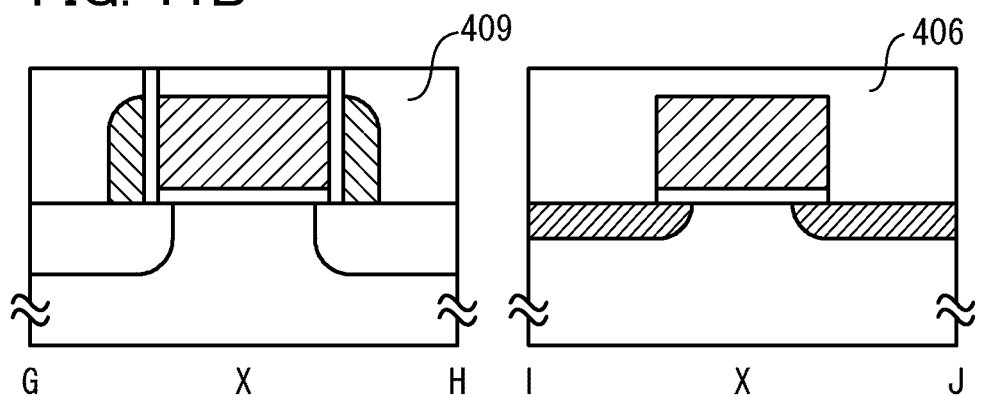
Figure 11C:
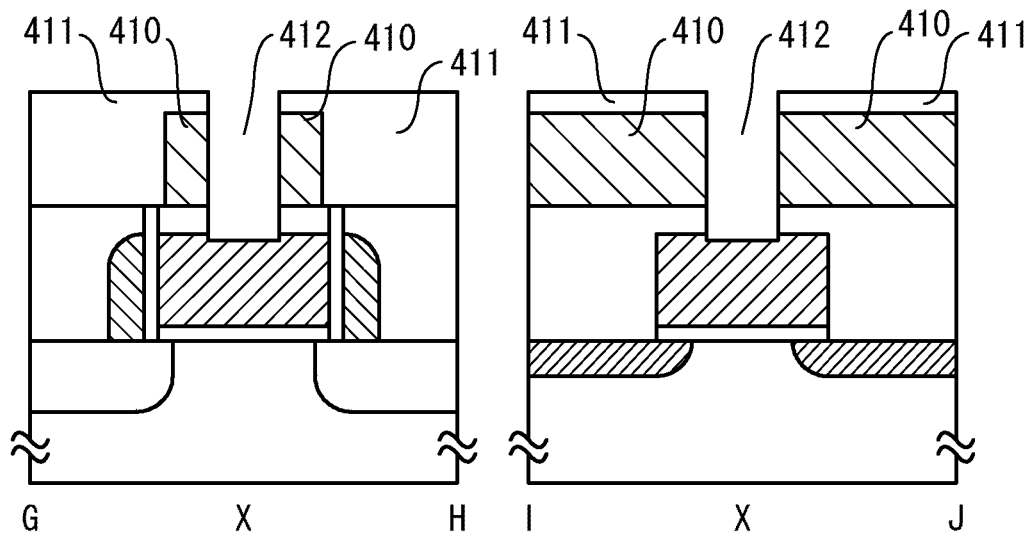
Figure 12A:
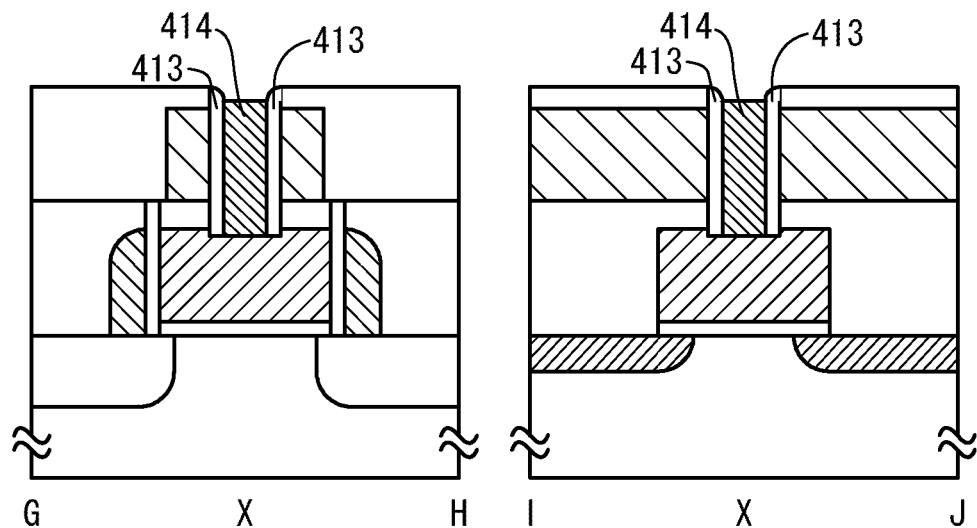
FIGS. 12A and 12B illustrate an example of a manufacturing process of a semiconductor memory device according to Embodiment 4.
Figure 12B:
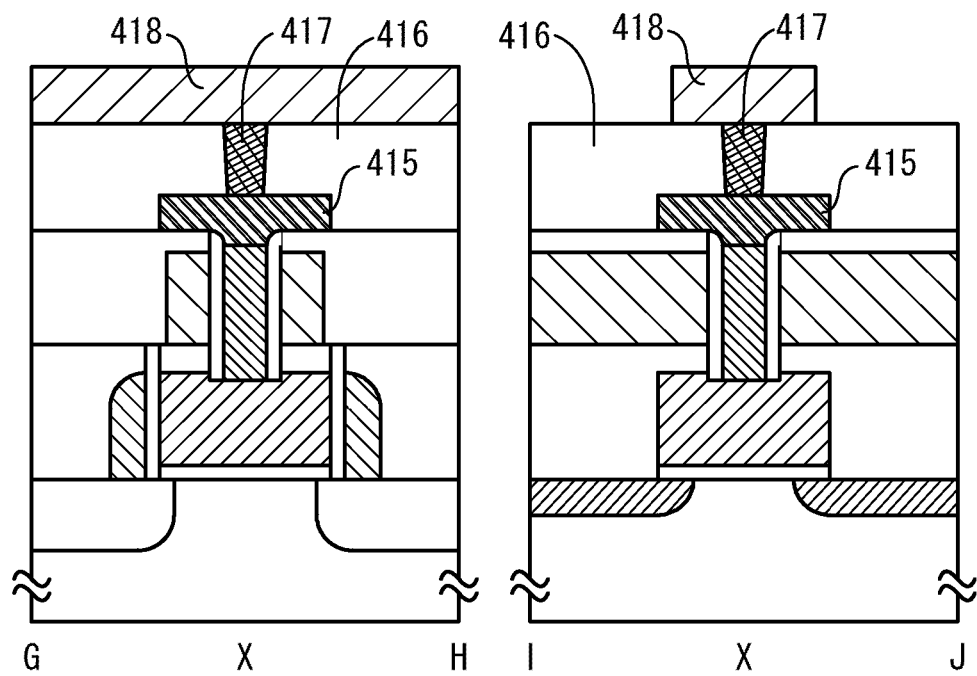

Third insulators 409 are formed by depositing an insulator and flattening its surface. FIG. 11B shows that a part of the second insulator 407 is etched off by the flattening process. However, the second insulator 407 may remain.

<FIG. 11C>

A third conductive layer 410 extending toward the word line direction is formed. Further, a fourth insulator 411 is formed over the third conductive layer 410. The surface of the fourth insulator 411 is flattened. Then, an opening portion 412 to the first conductive layer 404 is formed.

<FIG. 12A>

The opening portion 412 is filled by forming a second gate insulating film 413 on the side face of the opening portion 412, and forming a pillar semiconductor 414. Accordingly, a transistor is formed where the third conductive layer 410 and the second gate insulating film 413 are the gate and the gate insulating film, respectively. The third conductive layer 410 functions as a write word line. Note that the diameter of the opening portion 412 is determined in accordance with the channel width of the transistor and may be 10 nm to 50 nm, for example. Further, the thickness of the third conductive layer is determined in accordance with the channel length of the transistor and may be 100 nm to 500 nm, for example.

<FIG. 12B>

A fourth conductive layer 415 in contact with the pillar semiconductor 414 is formed. The material used for the fourth conductive layer 415 may be determined in accordance with the semiconductor material of the pillar semiconductor 414. Further, a fifth insulator 416 is formed, and a contact plug 417 to the fourth conductive layer 415 is embedded. Then, a fifth conductive layer 418 extending toward the bit line direction is formed. The fifth conductive layer 418 functions as a write bit line.

In this manner, a gain memory cell including two transistors and two capacitors can be manufactured. The area of the memory cell according to this embodiment can be 4 $F^2$ at a minimum. The first conductive layer 404 and the second conductive layers 408 form the capacitors of the memory cell. The capacitance of each of the capacitors can be determined in accordance with the height of the first conductive layer 404.

This application is based on Japanese Patent Application serial no. 2011-031788 filed with the Japan Patent Office on Feb. 17, 2011, the entire contents of which are hereby incorporated by reference.

What is claimed is:

1. A semiconductor memory device comprising a gain cell, the gain cell comprising:
    a read bit line formed in or over a substrate;
    a projecting insulator formed over the substrate;
    a write word line that is formed on a side surface of the projecting insulator and faces with a gate insulator interposed therebetween;
    a semiconductor interposed between the write word line and the side surface of the projecting insulator;
    an electrode provided over a top of the projecting insulator; and
    a write bit line that is provided over the projecting insulator and is electrically connected to the electrode.

2. The semiconductor memory device according to claim 1, wherein a height of the write word line is greater than or equal to 30% and less than or equal to 90% of a height of the projecting insulator.

3. The semiconductor memory device according to any one of claim 1, further comprising a driver circuit below the read bit line.

4. The semiconductor memory device according to claim 1, wherein the semiconductor includes a material whose band gap is greater than or equal to 2.5 eV and less than or equal to 4 eV.

5. The semiconductor memory device according to claim 1, wherein the semiconductor includes an oxide semiconductor.

6. A semiconductor memory device comprising a gain cell, the gain cell comprising:
    a read bit line formed in or over a substrate;
    a first conductive layer;
    a write word line that is formed over the first conductive layer;
    a semiconductor in contact with the first conductive layer;
    a first insulator interposed between the write word line and the semiconductor;
    a second conductive layer provided over an upper portion of the semiconductor, the second conductive layer being in contact with the semiconductor;
    a read word line that is formed on a side surface of the first conductive layer and faces with a second insulator interposed therebetween; and
    a write bit line that is provided over the second conductive layer and is electrically connected to the second conductive layer.

7. The semiconductor memory device according to claim 6, wherein the first conductive layer functions as a memory node of the gain cell.

8. The semiconductor memory device according to claim 6, wherein the first insulator is the same material as the second insulator.

9. The semiconductor memory device according to claim 6, further comprising a driver circuit below the read bit line.

10. The semiconductor memory device according to claim 6, wherein the semiconductor includes a material whose band gap is greater than or equal to 2.5 eV and less than or equal to 4 eV.

11. The semiconductor memory device according to claim 6, wherein the semiconductor includes an oxide semiconductor.

12. A method of manufacturing a semiconductor memory device comprising a gain cell, comprising the steps of:
    forming a read bit line in or over a substrate;
    forming a conductive layer over the read bit line;
    forming a first insulator over the conductive layer;
    forming a conductive film;
    forming a write word line over the conductive layer; and
    forming a read word line on a side surface of the conductive layer by anisotropically etching the conductive film.

13. The method of manufacturing a semiconductor memory device according to claim 12, wherein the write word line is formed at the step of the forming the read word line.

14. The method of manufacturing a semiconductor memory device according to claim 12, further comprising the step of:
    forming a semiconductor over the conductive layer, the semiconductor being in contact with the conductive layer.

* * * * *